United States Patent [19]
Zhang et al.

[11] Patent Number: 5,652,514
[45] Date of Patent: Jul. 29, 1997

[54] CORRECTION FOR FIELD VARIATION IN STEADY-STATE MRI BY REPEATED ACQUISITION OF ZERO K-SPACE LINE

[75] Inventors: Weiguo Zhang, Foster City; David M. Kramer, Tiburon; David M. Goldhaber, Berkeley, all of Calif.

[73] Assignee: Toshiba America MRI, Inc., Tustin, Calif.

[21] Appl. No.: 621,240

[22] Filed: Mar. 25, 1996

[51] Int. Cl.$^6$ ............................................. G01V 3/00
[52] U.S. Cl. ............................................. 324/307; 324/309
[58] Field of Search ............................ 324/300, 306, 324/307, 312, 313, 309

[56] References Cited

U.S. PATENT DOCUMENTS

| | | | |
|---|---|---|---|
| 4,885,542 | 12/1989 | Yao et al. | 324/313 |
| 4,968,935 | 11/1990 | Ehman et al. | 324/309 |
| 4,970,457 | 11/1990 | Kaufman et al. | 324/309 |
| 5,138,259 | 8/1992 | Schmitt et al. | 324/309 |
| 5,184,073 | 2/1993 | Takeuchi et al. | 324/309 |

FOREIGN PATENT DOCUMENTS 335981  10/1989  European Pat. Off. .

OTHER PUBLICATIONS

Edelstein et al., "Spin Warp NMR Imaging and Applications to Human Whole-body Imaging", *Phys. Med. Biol.*, 25, pp. 751–756 (1980).

Haase et al., "Flash Imaging. Rapid NMR Imaging Using Low Flip–Angle Pulses", J. Magn. Reson. 67, pp. 258–266 (1986).

Ehman, et al., "Adaptive Technique For High–Definition MR Imaging of Moving Structures", Radiology, vol. 173, pp. 255–263 (1989).

Hu et al., "Reduction of Signal Fluctuation in Functional MRI Using Navigator Echoes", MRM, vol. 31, pp. 495–503 (1994).

Zur et al., "Spoiling of Transverse Magnetization in Steady–state Sequences", *Magn. Reson. Med.*, 21, pp. 251–263 (1991).

Le et al., "Retrospective Estimation and Correction of Physiological Artifacts in fMRI By Direct Extraction of Physiological Activity from MR Data," MRM, vol. 35, pp. 290–298 (1996).

*Primary Examiner*—Louis M. Arana
*Attorney, Agent, or Firm*—Nixon & Vanderhye P.C.

[57] ABSTRACT

Methods and apparatus for correcting image artefacts caused by variations in the main magnetic field of an MRI system are disclosed, particularly for MRI with steady-state spin precession. For field correction in MRI with steady-state spin precession, the effects of the field changes can be corrected by quantifying the time course of the field drifts by repeated acquisition of the zero k-space lines. The change in the phase between consecutive zero k-space lines is used as an indicator of field variation and for correction of associated image artifacts. By using for field correction the zero k-space lines acquired using the imaging sequence itself, the steady-states of spin precession are undisturbed throughout the MRI data acquisition.

14 Claims, 6 Drawing Sheets

CORRECTION FOR FIELD VARIATION IN STEADY-STATE MRI BY REPEATED ACQUISITION OF ZERO K-SPACE LINE

The present invention relates to Nuclear Magnetic Resonance (NMR) imaging. More particularly, it relates to NMR imaging methods for correcting image artefacts caused by variations in the main magnetic field over time.

BACKGROUND OF THE INVENTION

Magnetic Resonance Imaging (MRI) is now a widely accepted and commercially available technique for obtaining digitized visual images representing the internal structure of objects (such as the human body) having substantial populations of nuclei which are susceptible to NMR phenomena. In MRI certain nuclei of a body to be imaged are polarized by imposing a strong main magnetic field $H_0$ on them. Then, selected nuclei are excited by imposing on the nuclei an RF signal at a particular NMR frequency. By spatially distributing the localized magnetic fields, imposing an RF signal to them, and then suitably analyzing the resulting RF responses from the nuclei, a map or image of relative NMR responses as a function of the location of the nuclei can be determined. Following a Fourier analysis, data representing the population of nuclei in space can be displayed on a CRT.

As shown in FIG. 1, the NMR imaging system typically includes a magnet 10 to impose the static magnetic field, gradient coils 12 for imposing spatially distributed magnetic fields in the three orthogonal coordinates, and RF coils 14 to transmit and receive RF signals to and from the selected nuclei. The NMR signal received by the coil 14 is transmitted to a computer 16 which processes the data into an image displayed on the display 18. The computer 16 also controls the operation of the RF coils 14 and gradient coils 12 through the RF amplifier 20 and gradient amplifiers 22, respectively.

An example operation of how the various coils produce the NMR signal in 2D MRI is shown in FIG. 2, which is a graphical representation of a typical NMR acquisition sequence at steady-state. First, a gradient field $G_Z$ is applied to sensitize a slice of nuclei in the body to be imaged to a particular RF resonance frequency. An RF nutation pulse is then applied at the particular frequency to force some of the nuclei to precess in perpendicular to the main field. Thereafter, a changing gradient field $G_Y$ phase encodes the nuclei in the Y-axis direction by altering the frequency differences (and hence the phase) between nuclei in different locations along the Y-axis. A gradient field $G_X$ first dephases and then rephases the nuclei to form a field-echo NMR signal. During the field-echo, the gradient field $G_X$ frequency encodes the selected slice of nuclei in the X-axis direction. The resultant NMR signal is then read and analyzed by Fourier analysis. The frequency (domain) plot of that analysis is then scaled to render information about the nuclei population in Fourier space, which corresponds to an X-Y-Z position.

The above examples rely on a non-varying main magnetic field that polarizes the nuclei. Otherwise, time-variation of the main magnetic field can cause anomalies in the slice selection, the phase encoding, and the frequency encoding steps during data acquisition. Ideally, the main magnetic field is assumed to be perfectly stable. The phase encoding gradient field, $G_Y$, for example, would then superimpose a magnetic field varying linearly in the Y-direction while being constant in all other dimensions. The total magnetic field in the Y-direction in this example would be the sum of $H_0$ and $G_Y$. The phase of the nuclei is then locally encoded only by their position along the Y-direction.

In reality, however, small spurious changes occur in the main magnetic field during MRI data measurement processes. The changes over time of the main magnetic field can introduce spurious changes in slice position, and in the phase and frequency of the nuclei. Unless these spurious changes are corrected, the original spatial encoding will be aberrant, causing artifacts in the resultant NMR image.

For example, the magnetic gradient fields produce eddy currents, which induce a time-varying magnetic field, thereby causing variations in the main magnetic field. This is particularly true of the magnetic gradient pulses used to achieve slice/volume selective NMR responses, which are of substantially greater intensity/duration than other magnetic gradient pulses and, accordingly, are often the principal source of spurious magnetic fields due to induced eddy currents. Other system or environmental characteristics (such as temperature, system vibration, etc.) can also cause variations and drift in the main field.

This drift can have an impact on image accuracy. In Fourier Transform (FT) MRI, the acquisition time of each echo signal (the "read-out time") is on the order of milliseconds, while the total data collection time (the "total time") is on the order of minutes. When the main magnetic field changes on a time scale which is slow for the "read-out time" but fast for the "total time", image artifacts will be generated, mainly in the phase-encoding direction(s). These artifacts, in many cases, render the images useless. That is, the field variations induce phase errors in the recorded signals, causing the Fourier analysis to misidentify the spatial distribution of nuclei populations. The misidentifications appear as artifacts on the CRT display.

One spectroscopic method previously developed (U.S. Pat. No. 4,885,542) for correcting spurious changes in the main magnetic field requires high-resolution NMR signals be acquired and used to quantify the time course of the main field. These signals record changes in the main field which are then used during data processing to correct for the field change and to eliminate the associated image artifacts. In particular, according to this method, a template or calibration NMR response is obtained from each slice without phase or frequency encoding. The strength of the main field is quantified from the frequency of the NMR signal. The MRI signals for the slice are corrected in accordance with the calibration response. In practice, for example, if one desired 128 projections (phase-encoding steps), 137 measurement cycles may be employed with the extra 9 cycles being calibration cycles for recording the main field and for correcting the remaining 128 cycles used in the image reconstruction.

Although the spectroscopic approach produces, in many cases, satisfactory results, it has limitations. First, it requires acquisition of high-resolution NMR signals for calibration. This unfortunately demands a long acquisition duration to achieve sufficient frequency resolution, meaning that the sequence segment for acquiring the field information has very different RF and field gradient characteristics than the imaging segment. Insertion of such a segment amid the image data acquisition can significantly alter the image contrast. Second, when the imaging sequence requires steady-states of the nuclear spin precession, insertion of the spectroscopic calibration segment will interrupt the steady-states. Such perturbation to the imaging sequence will not only affect image contrast, it will produce image artifacts by itself.

SUMMARY OF THE INVENTION

Instead of using high resolution NMR signals recorded during the MRI acquisition to quantify variations in the main field, the present invention uses MRI echo signals acquired without phase-encoding (zero k-space lines) for data correction. The present invention thus uses a single sequence segment for both imaging and calibration. Since no different spin perturbation is introduced by the calibration procedure, the image contrast remains unaffected and the spin steady-states are maintained throughout the data acquisition.

The present invention extracts sufficient information from the repeated zero k-space lines to quantify and correct phase errors caused by main magnetic field drift.

BRIEF DESCRIPTION OF THE DRAWINGS

The purpose and advantages gained by the present invention will be understood by careful study of the following detailed description of the presently preferred embodiment with particular reference to the accompanying drawings.

DETAILED DESCRIPTION OF THE PRESENTLY PREFERRED EMBODIMENT

As is well-known, nuclei precess at a particular frequency with a particular phase. By applying gradient fields to the nuclei in different orthogonal directions, the frequency and phase of the precessions can be used to spatially encode the nuclei. That is, in one orthogonal direction, a "slice" of nuclei are excited. Within that slice, NMR signals can be extracted from the remaining two dimensions of the slice using the frequency of precession of the selected nuclei to spatially encode the nuclei in one direction and using the phase of precession of the selected nuclei to spatially encode the nuclei in the second direction. By analyzing the frequency and phase of the resultant NMR signal, information about the nuclei density in the selected slice can be determined.

Figure 1:
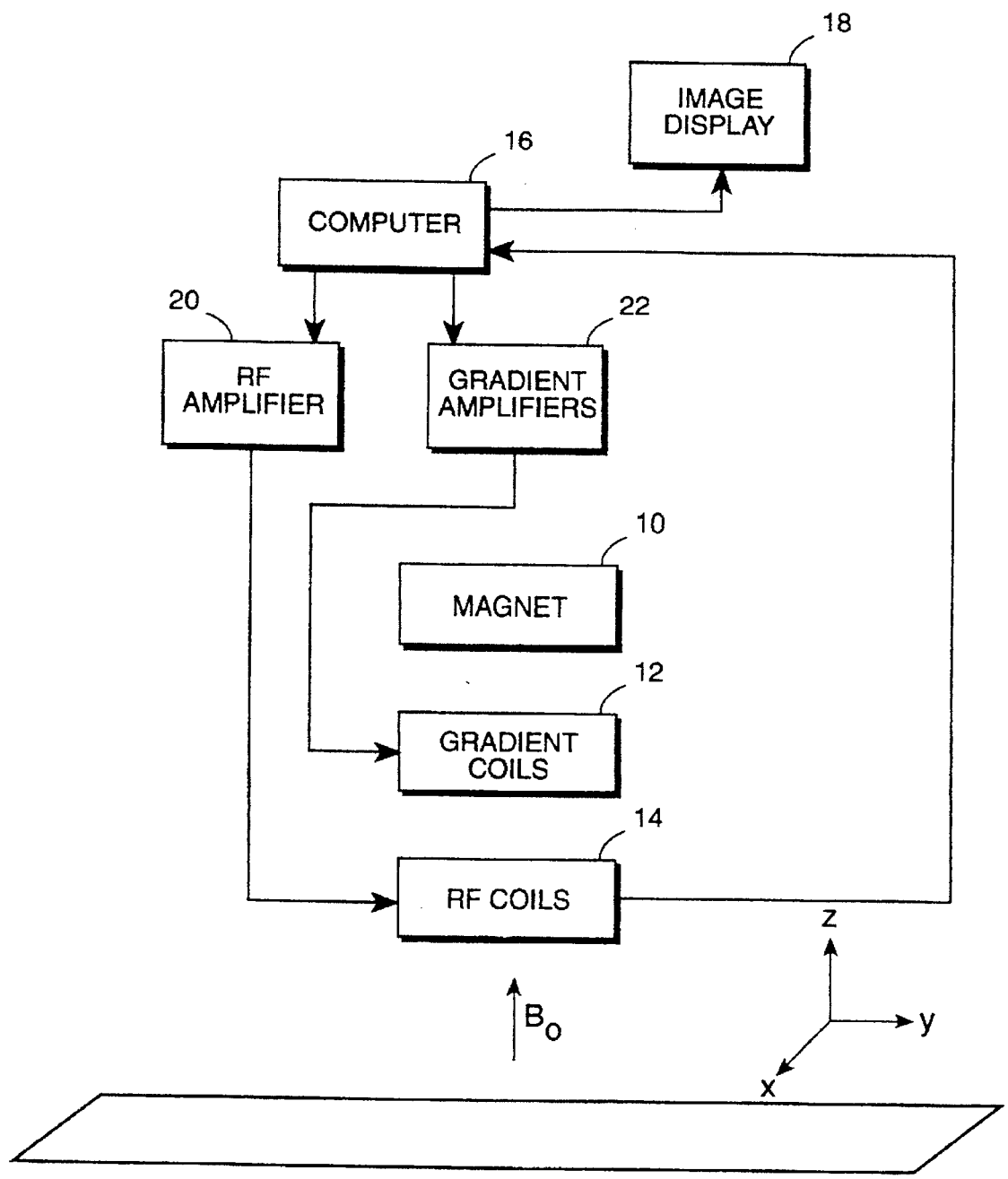
FIG. 1 is a schematic view of an MRI system.
Figure 2:
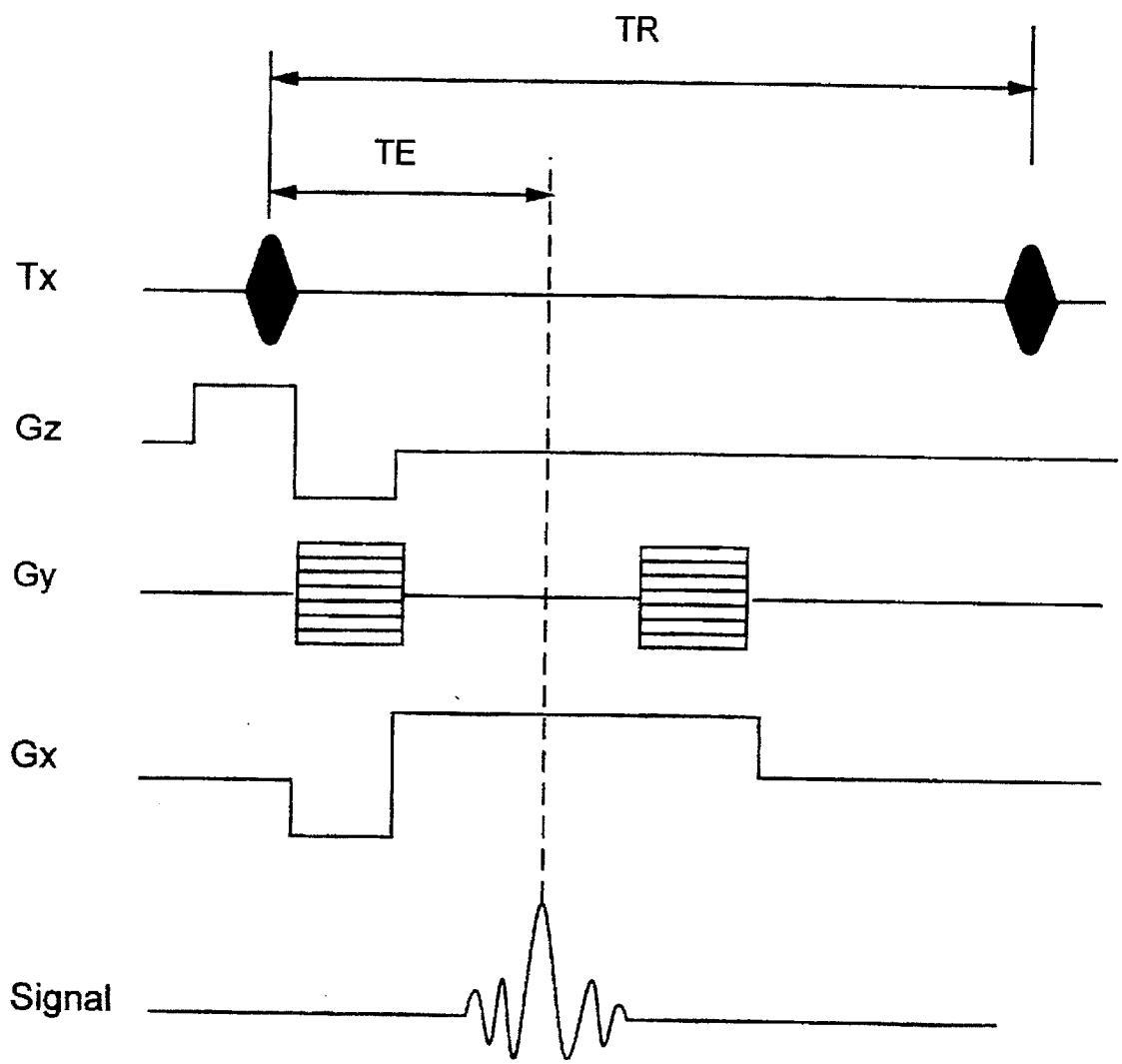
FIG. 2 is a diagram of a 2D MRI pulse sequence with steady state free precession.

FIG. 2 illustrates a typical 2D MRI acquisition sequence with steady-state spin precession. In FIG. 2, an NMR signal is obtained after an echo time (TE) following an RF transmission pulse. The repetition time (TR) between adjacent transmission pulses is also illustrated. A transmission pulse ($T_X$) nutates the selected nuclei in a slice identified by the gradient magnetic field $G_Z$. Thereafter, a changing gradient field $G_Y$ phase encodes the nuclei within the selected slice. The third gradient magnetic field, $G_X$, frequency encodes the nuclei in the slice selection, resulting in the NMR signal. Thereafter, the sequence repeats with another transmission signal $T_x$. As can be seen from the sequence, the steady-state spin precession of the nuclei depends on the imaging sequence used. Insertion of a very different sequence segment amid the imaging sequence will perturb the steady-state spin precession. The imposition of the transmission signal and the gradient magnetic fields are carefully controlled to impose predictable reactions from the selected nuclei, provided the nuclei are not significantly disturbed in any other way during the NMR sequencing procedure.

For example, ideally, the main magnetic field $B_0$ remains perfectly stable during application of the gradient fields used to spatially distribute the frequency and phase encoding. In reality, however, the main magnetic field may flunctuate and corrections should be made in the NMR data to accommodate field drift. The present invention recognizes that in MRI acquisitions under steady state spin precession, the effects of the $B_o$ field variations can be corrected by acquiring and analyzing phase information of the zero k-space lines acquired at different times.

A spatially homogenous main magnetic field is described as:

$$B_o = B_{oo} + \Delta B_{oo}(t), \quad (1)$$

where $B_{oo}$ is the main static homogenous magnetic field strength, and $\Delta B_{oo}(t)$ is the time-variation of the field.

The MR signal acquired using a 2D imaging sequence can be described in k-space by $$S(k_x, k_y) = \iint M(x,y) e^{-i\phi_0(t)} e^{-i2\pi k_x x} e^{-i2\pi k_y y} dx dy \quad (2)$$

where M (x,y) is magnetization available at (x,y) of the selected slice, t is the time when S ($k_x=0$, $k_y$) is acquired in relation to the commencement of the imaging sequence. $\phi_0$ (t) is the "would be" phase of the MR signal if all encoding gradients were zero. $\phi_0$ is therefore referred to here as the base-phase or calibration phase. Assuming that the field change during the time for collecting a single $k_x$ line is neglible, it is mainly the variation of $\phi_0$ between the $k_x$ lines which is responsible for the image artefacts related to field variation.

The aim of field correction procedures is to correct the MRI data so that the effects of the field drifts are compensated. With a complete compensation of field drifts, the MRI data should become:

$$S_{corr}(k_x, k_y) = \iint M(x,y) e^{-i2\pi k_x x} e^{-i2\pi k_y y} dx dy. \quad (3)$$

An MRI data line in k-space represents an averaged read-out signal with a certain value of the phase-encoding gradient. A data line with zero phase-encoding gradient is called a zero k-space line, or simply a zero line. That is, if X is the read direction, the zero k-space line corresponds to $K_y=0$. In the present invention, a series of zero k-space lines are acquired using the same imaging sequence. The field data is thus the same as the imaging data except that it is obtained over time without phase-encoding.

When the MRI signal contains only a single component and no significant phase drifts exist between the signal averages, a series of repeated zero k-space lines acquired at different times can be described by:

$$S(k_x,t)=e^{-i\phi_0(t)}\iint M(x,y)e^{-i2\pi k_x x}dxdy. \quad (4)$$

Assuming no other system instabilities exist, the only sources which produce changes between the zero lines are field drifts. In other words, any phase drifts of the MRI data can be quantified from the zero-line series by measuring the phase differences between the zero lines. The algorithm for quantifying these field drifts from a zero-line series is described below.

Since the zero-line series can be acquired using exactly the same sequence as that for the MRI data, field drifts can thus be quantified without perturbing the steady-state spin precession established by the imaging sequence.

Figure 3A:
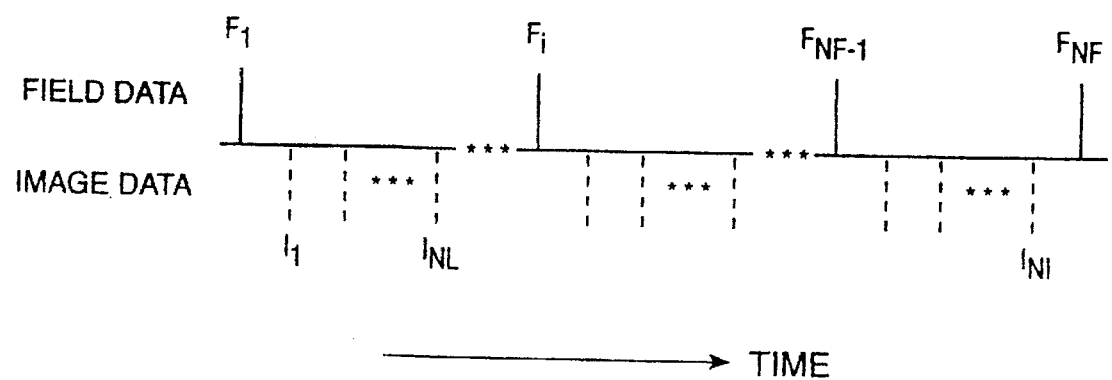
FIG. 3A is a timing sequence for obtaining field and image data.

FIG. 3A depicts an MRI data acquisition with repeated zero k-space lines for field correction. Each acquisition results in a full k-space data line. $F_i$ represents acquisition of zero k-space lines, also referred to as field lines, used for field correction. $I_i$ represents image data lines. NF is the total number of field lines acquired. NL is the number of image lines acquired between two consecutive field lines. NI is the total number of image lines acquired. Thus, $$NL = \frac{NI}{NF-1} \quad (5)$$

Figures 3B, 3C, 3D:
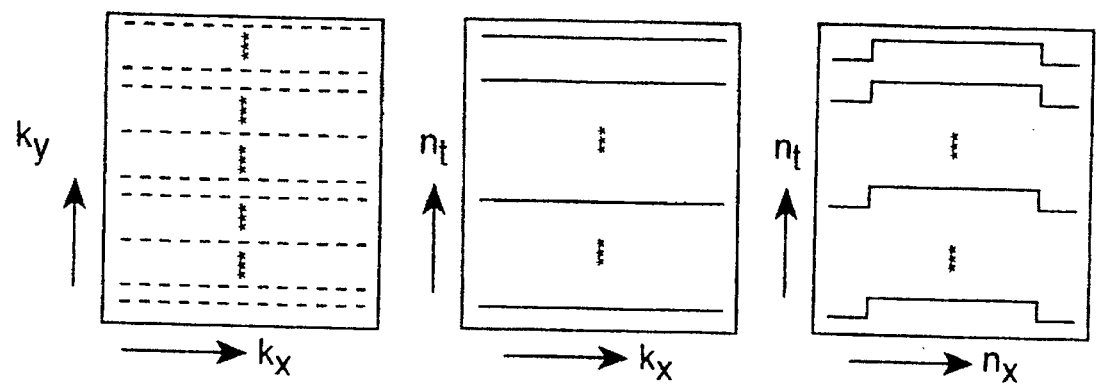
FIGS. 3B–C are image and field data matrices in k-space obtained by rearranging the field and image data acquired from FIG. 3A.
FIG. 3D is a field data matrix of the field data in FIG. 3C, after 1D Fourier Transformation along the read-out direction.

The field lines and the image lines are acquired using a single sequence except that the phase-encoding gradients are switched off for acquisitions of the field lines. The acquired data is sorted into two matrices: the image data matrix shown in FIG. 3B and the field data matrix shown in FIG. 3C. The field data of FIG. 3C are transformed into a hybrid domain shown in FIG. 3D by 1D Fourier transformation only along the read-out direction. Each k-space data line becomes a profile of the object after 1D Fourier transformation along the read-out direction. The field data, which is a series of zero lines in k-space, contains a series of profiles (denoted as field profiles) in that hybrid domain.

With the field profiles, the following algorithms are then used to quantify the main magnetic field and to correct the effects of field drifts on the MRI data.

After 1D Fourier transformation along the read-out direction, the field data can be described by $$S_F(n_x,n_t)=\int M(n_x\Delta x,y)e^{-i\phi_0(n_t)}dy \quad (6)$$

where $\Delta x$ is the spatial resolution in the read-out direction.

The phases of the field profiles are determined according to:

$$\phi_F(n_x,n_t)=arg\{S_F(n_x,n_t)\} \quad (7)$$

The phase increments between two consecutive field profiles are calculated:

$$\Delta\phi_F(n_x,n_t)=\phi_F(n_x,n_t+1)-\phi_F(n_x,n_t). \quad (8)$$

Since $\phi_F$ is unambiguous only within $\pm\pi$, unwrapping is executed if phase wraparound is detected:
if $$|\Delta\phi_F(n_x,n_t)|>(2\pi-\Delta\phi_{threshold}), \Delta\phi'_F(n_x,n_t)=\Delta\phi_F(n_x,n_t)-sign(\Delta\phi_F(n_x,n_t))\times 2\pi, \quad (9)$$

otherwise, $$\Delta\phi'_F(n_x,n_t)=\Delta\phi_F(n_x,n_t), \quad (10)$$

where $\Delta\phi_{threshold}$ is the maximum phase drift expected between two neighboring field profiles, and sign () returns a value of +1 if the input is positive or −1 if negative.

Since the effects of the field change on the MRI signal is a global phase shift when the MRI signal contains a single component, it can be assumed in such cases that $\Delta\phi'_F(n_x,n_t)$ is the same for all $n_x$ with the same $n_t$. Therefore, $\Delta\phi'_F(n_x,n_t)$ can be fit to a constant against $n_x$ to obtain $\Delta\phi_F^{fit}(n_t)$. To effectively reduce the effects of noise, linear fitting is performed with least squares weighted by the signal magnitudes:

$$\Delta\phi_F^{fit}(n_t) = \frac{\sum_{n_x=1}^{N_x} |S_F(n_x,n_t)| \cdot \Delta\phi'_F(n_x,n_t)}{\sum_{n_x=1}^{N_x} |S_F(n_x,n_t)|} \quad (11)$$

where $N_x$ is the total number of data points along the read-out direction.

One of the field profiles, preferably the one that is most immediately adjacent in its acquisition time to the zero k-space line of the image data set, is taken as the internal phase reference. The relative phase drifts of the other field profiles are then calculated:

$$\phi_F^{fit}(n_t) = \sum_{j=n_t^{ref}}^{n_t} s \cdot \Delta\phi_F^{fit}(j),$$

with $$s=+1, \text{ if } n_t > n_t^{ref}, \quad (12)$$

or $$s=-1, \text{ if } n_t < n_t^{ref}.$$

where $n_t^{ref}$ is the field data profile used as the phase reference.

The phase drifts of the image data set are obtained from the phase drifts of the field data set by linear data interpolation. If the acquisition rate of the repeated "field lines" is controlled so that the phase drifts can be assumed monotonous between the two consecutive field profiles, and if the phase change between the two neighboring "field lines" is sufficiently small so that simple linear data interpolation methods can be used for obtaining its approximate values in between, increments of the base-phase between the image data lines can be obtained from the field data by linear interpolation. For an image data line ($n_y$) which is acquired as the $Q_{th}$ + image data line after the acquisition of the $P_{th}$ field data line, the phase drift of the image line is determined according to:

$$\phi_I^{fit}(n_y) = \phi_F^{fit}(P) + (\phi_F^{fit}(P+1) - \phi_F^{fit}(P)) \cdot \frac{Q+}{NL+1} \quad (13)$$

The image data is then corrected for field drifts by:

$$S_{corr}(n_x\Delta k_x, n_y\Delta k_y) = \quad (14)$$

$$S(n_x\Delta k_x,n_y\Delta k_y)e^{+i\phi_I^{fit}(n_y)[1+(n_x-\frac{N_x}{2})\frac{1}{f_x TE}]},$$

where TE is the echo-time of the imaging sequence, and $f_x$ is the read-out sampling rate.

Included in the correction are both the zero-order and the first-order phase corrections. The zero-order phase correction compensates the phase drifts induced by field changes, and the first-order phase correction accounts for pixel shifts in the read-out direction due to field drifts.

Even in cases where the phase change and the field variation has a non-linear and spatially dependent relationship, phase drifts quantified from the zero k-space lines are still good approximations of the phase changes in the MRI data induced by the field variation. Correction of the MRI data based on the zero k-space lines can still result in significant reduction of image artifacts.

Since the zero k-space lines are acquired using the imaging sequence itself, the present invention thus does not add any extra sequence to the routine scan sequence used by the MRI system.

Though the above descriptions are given for 2D MRI with spatially homogenous main magnetic field, the conclusions are also valid for 3D and with inhomogenous main magnetic field.

Experimental Corroboration

MRI experiments to corroborate the above analysis were performed on a Toshiba ACCESS instrument equipped with a 0.064 Tesla permanent magnet. Time variation of the main magnetic field was generated using an external field generator which produced a sine-wave field change with a magnitude of 4 mGauss and with a frequency of 0.03 Hz.

Phantom experiments were performed using a two-container phantom. One container was filled with water and the second container was filled with "baby oil" (fat). Human head images were acquired using one of the inventors as the object.

All data were acquired in 3D mode using a gradient-echo sequence with TE=30 ms, TR=55 ms, FOV=35 cm×35 cm×16 cm, matrix size=256×256×16, flip angle=30° along with RF spoiling. One signal average was acquired for the phantom images. The human head images were acquired with two signal averages performed before the phase-encoding loops.

One field line was acquired for every 16 image lines, resulting in a total of 257 field lines for each data set. The time delay between two consecutive field lines was thus 935 ms for the phantom images and 1870 ms for the human head images.

Figure 4A:
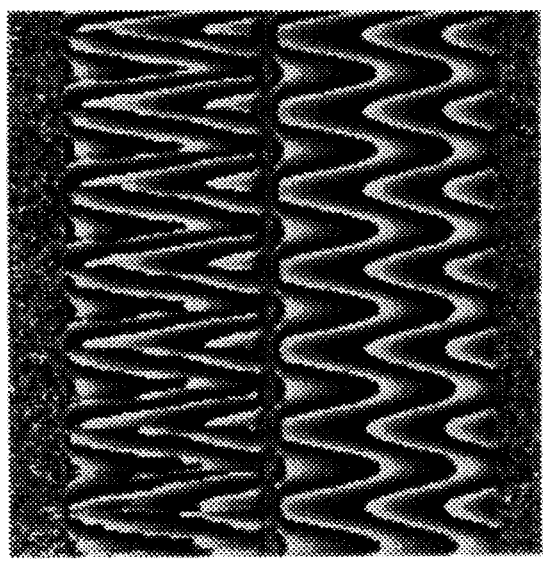
FIG. 4A shows the phases of a field data set after 1D FT along the read-out direction.
Figure 4B:
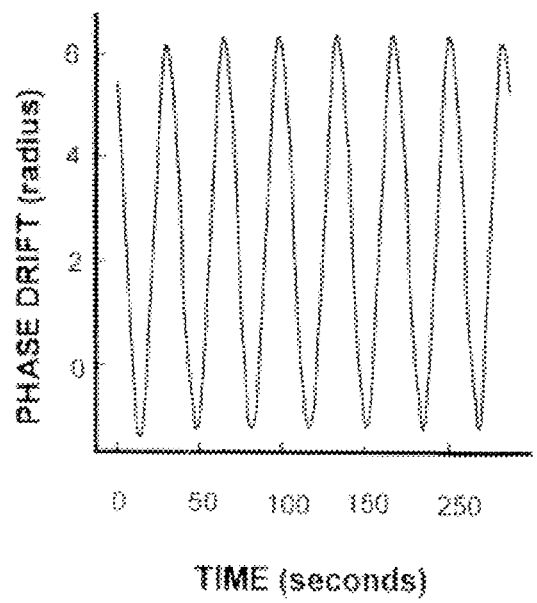
FIG. 4B shows the phase drifts of the field data of FIG. 4A.
Figure 4C:
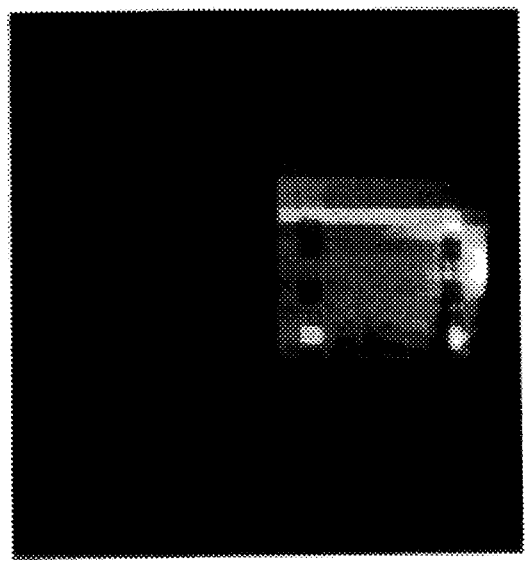
FIG. 4C is one of the MR images before field correction, acquired along with the field data of FIG. 4A.
Figure 4D:
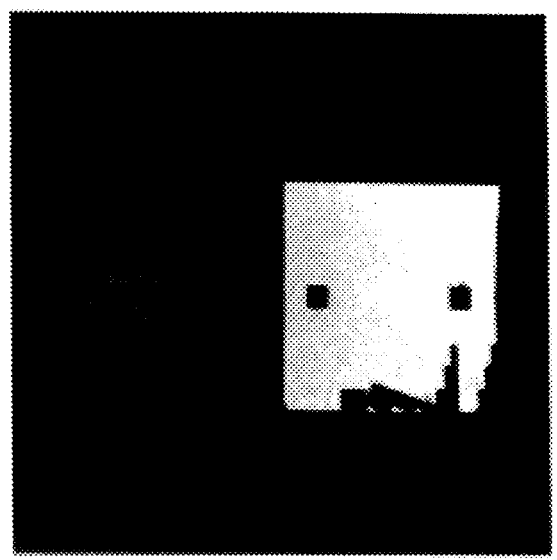
FIG. 4D is the same image of FIG. 4C, but after field correction.

FIG. 4A shows the phases of the field data in the hybrid domain after 1D FT along the read-out direction (horizontal). Shown in FIG. 4B are phase drifts quantitated from the field data by weighted least-square linear fitting. FIG. 4C is one of the images of the phantom before correction and FIG. 4D is the same image after field correction using the present invention.

Figure 5A:
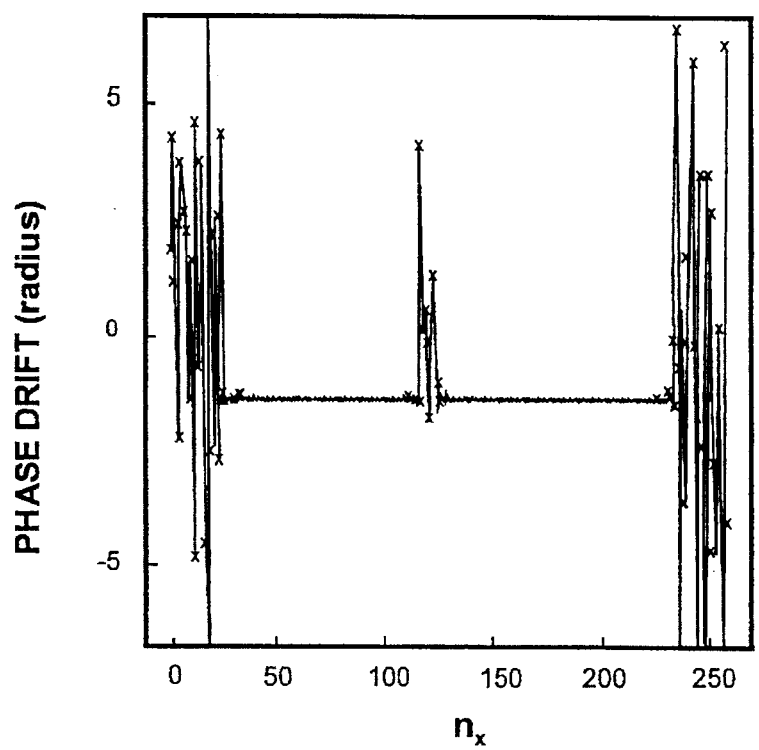
FIGS. 5A and 5B are graphical representations of the phase increments between two consecutive field lines along the read-out direction and over time, respectively.
Figure 5B:
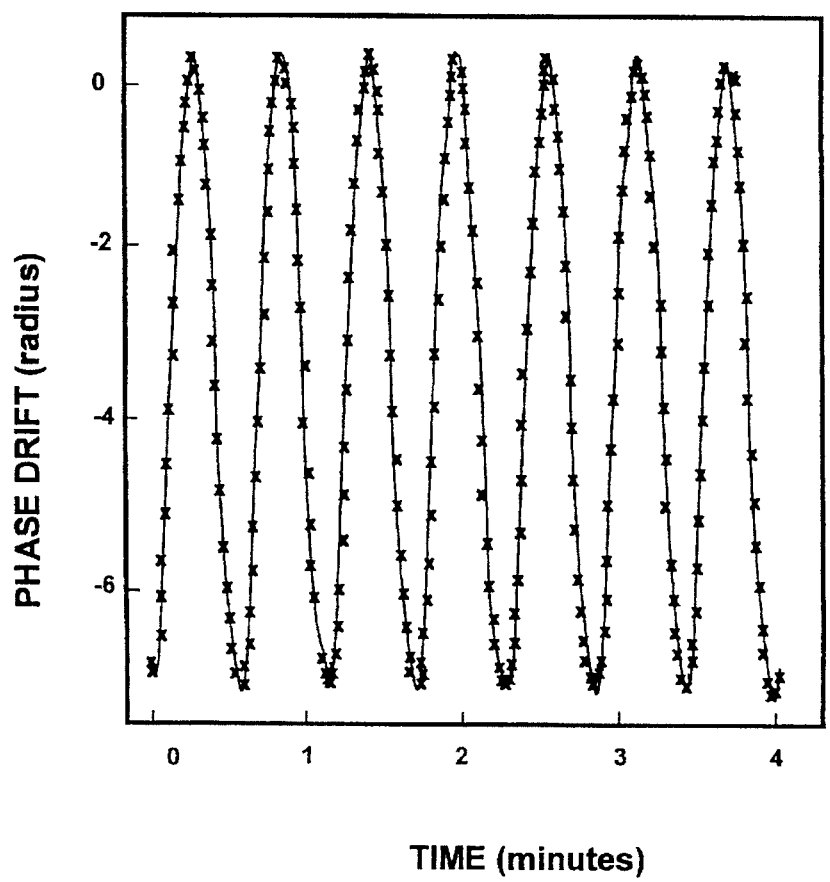

FIGS. 5A and 5B shows phase changes between two consecutive field data lines in the hybrid domain: (A) along the read-out direction, and (B) as a function of time.

Figure 6A:
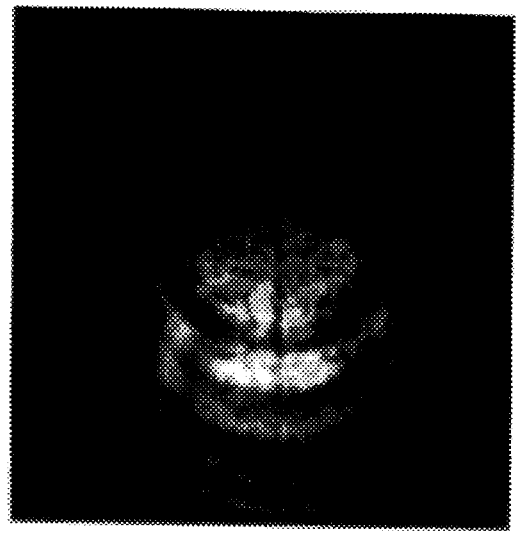
FIG. 6A is an MR image of a human head before field correction.
Figure 6B:
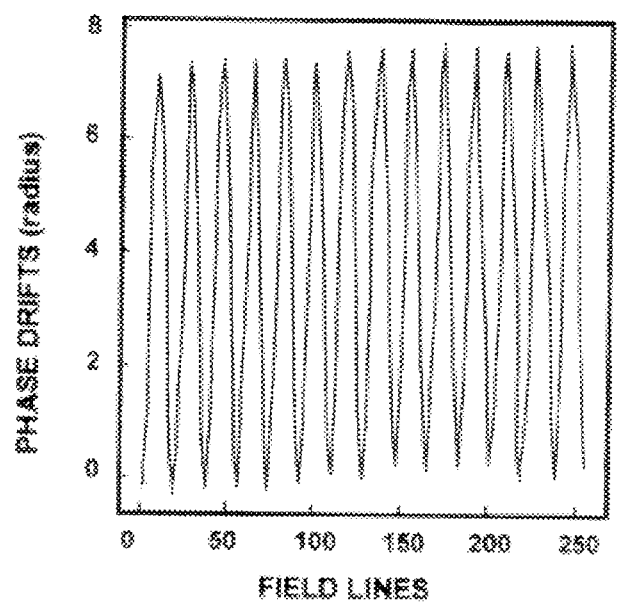
FIG. 6B shows the phase drifts of the field data acquired along with the image data of FIG. 6A.
Figure 6C:
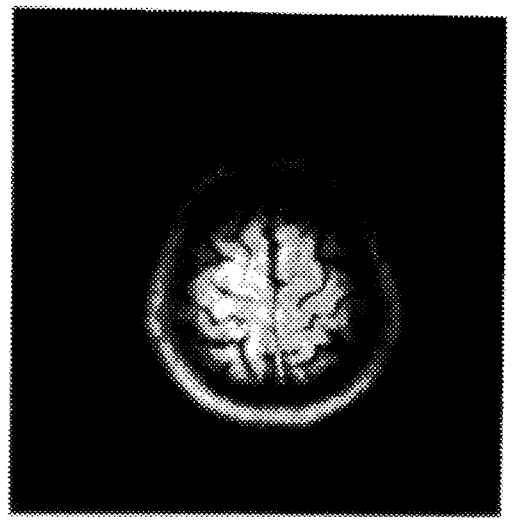
FIG. 6C is the same image of FIG. 6A, but after field correction.

Shown in FIGS. 6A, 6B and 6C are MR data of a human head: (A) one of the MR images before field correction; (B) phase drifts of the field data obtained by weighted least square linear fitting; and (C) the same as of (B) after field correction using the present invention.

When MRI data are acquired under steady-state spin precession, the field correction method developed in this study has a very important advantage. Since the imaging sequence is used for the acquisitions of both the MRI data and the field data, spin precession is not interrupted by the acquisitions of the field data, so that steady-state spin precession can be maintained throughout the data acquisition. This is particularly important for RF spoiling of the transverse steady-state magnetization, which requires that steady-state spin precession be maintained.

Time-variation of the magnetic field in MRI can be induced by other than the imaging system itself. In functional MRI (fMRI), it is the alteration in hemoglobin oxygenation which induces changes in local magnetic fields. Functional MRI are usually performed under steady-state spin precession in order to achieve higher time resolution. In interpreting fMRI data, the effects of the field changes on the MRI sequence itself should be considered, particularly in regard to possible image artifacts.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An NMR steady state spin precession imaging sequence, comprising the steps of:

1) magnetically orienting nuclei in a body to be imaged;
   2) nutating the oriented nuclei by an RF signal;
   3) with a zero phase gradient on the oriented nuclei, reading and storing a field line from the oriented nuclei;
   4) repeating step 2);
   5) reading and storing an image line from the nutated nuclei;
   6) repeating steps 4) and 5) for a plurality of image lines;
   7) repeating steps 2) to 6) for a predetermined number of data acquisitions;
   8) transforming the field lines into corresponding field profiles in a hybrid domain by 1D FT along the read-out direction;
   9) calculating the phase increment between different field profiles over time; and
   10) correcting for phase drifts in the plurality of image lines by interpolating the phase drifts from that identified in step 9) onto the image lines.

2. An MRI sequence according to claim 1, further comprising the steps, after step 9, of:

9A) detecting phase wraparound; and
   9B) if wraparound is detected in step 9A, correcting the phase increment for phase wraparound.

3. An MRI sequence according to claim 2, wherein:

the step 9B) includes the step of linearly fitting the phase increments with weighted least squares.

4. An MRI sequence according to claim 1, wherein:

the field profiles are the field data after 1D Fourier transformation along the read-out direction.

5. An MRI sequence according to claim 1, wherein step 9) includes the steps of:

9C) selecting a field profile as a reference; and
   9D) calculating the phase drifts of other field profiles in relation to the reference profile.

6. A method of correcting for phase changes associated with changes in the main magnetic field during NMR imaging with steady state spin precession, comprising the steps of:

1) without the imposition of a phase-encoding gradient field, obtaining a field data line corresponding to the zero k-space position of an image data set;
   2) obtaining a plurality of NMR image lines;
   3) repeating steps 1) and 2) for a plurality of data acquisitions over time;
   4) calculating the phase drifts between different field profiles over time; and
   5) correcting for phase drifts in the plurality of image lines by interpolating the phase from that identified in step 4) onto corresponding NMR image lines obtained in step 2).

7. A method according to claim 6, wherein step 4) includes the steps of:

4A) sorting the field image lines into a matrix of field image lines, wherein the matrix has one axis as the read-out direction in k-space and a second axis as time;

4B) transforming the matrix of field data lines from the time domain to the frequency domain; and 4C) calculating the phase drifts between different field data lines transformed in step 4B).

8. A method according to claim 7, wherein step 4C) includes the steps of:

4D) calculating the phase increments between consecutive field lines;

4E) correcting the phase increments for phase wraparound; and 4F) calculating phase drifts between the field lines.

9. A method according to claim 8, wherein step 4F) includes the steps of:

4G) linearly fitting the phase increments identified in step 4E) with weighted least-squares;

4H) selecting a field data line as a reference; and 4I) calculating the phase difference between the reference field data line and other field data lines.

10. A method of correcting steady state MRI imaging data for the effects of magnetic field variations, comprising the steps of:

1) taking field data as zero k-space lines at different times;

2) transforming the field data along the read-out direction from the time domain to the frequency domain to obtain a series of corresponding field profiles;

3) determining the phases of the field profiles;

4) calculating phase drifts as increments between the consecutive field profiles; and 5) correcting the imaging data according to the phase drifts obtained in step 4).

11. A method according to claim 10, further comprising the steps, after step 4), of:

4A) detecting for phase wraparound; and 4B) if phase wraparound is detected in step 4A), unwrapping the phase.

12. A method according to claim 10, wherein step 2) includes the steps of:

2A) preparing a matrix of the field data with dimensions of the read-out direction versus time; and 2B) transforming the matrix into the corresponding field profiles with dimensions of frequency versus time.

13. A method according to claim 10, wherein step 5) includes the step of:

5A) linearly interpolating the phase drifts onto the imaging data.

14. A method according to claim 10, further including the step of applying varying phase encoding gradient fields;

the method further including the step after step 1), of:

1A) taking the field data between a plurality of the imaging data with the varying phase-encoding gradient fields;

the method further including the steps, after step 4), of:

4C) linearly fitting the phase increments identified in step 4B) using weighted least-squares;

4D) calculating the phase drifts using one of the field profiles as a phase reference; and 4E) storing the phase drifts of the field profiles as a function of time, and wherein step 5) includes the step of:

5A) linearly interpolating the phase drifts of the field profiles as a function of time onto the imaging data taken in step 1A).

* * * * *